US007623981B2

(12) United States Patent  
Achkar et al.

(10) Patent No.: US 7,623,981 B2  
(45) Date of Patent: Nov. 24, 2009

(54) TESTING OF EMBEDDED SYSTEMS

(75) Inventors: Hani Achkar, Victoria (AU); Robert Douglas Nedelkovski, Victoria (AU)

(73) Assignee: VFS Technologies Limited, Nassau (BS)

( * ) Notice: Subject to any disclaimer, the term of this patent is extended or adjusted under 35 U.S.C. 154(b) by 0 days.

(21) Appl. No.: 10/591,492

(22) PCT Filed: Mar. 4, 2005

(86) PCT No.: PCT/AU2005/000313

§ 371 (c)(1),
(2), (4) Date: Jul. 5, 2007

(87) PCT Pub. No.: WO2005/085888

PCT Pub. Date: Sep. 15, 2005

(65) Prior Publication Data

US 2007/0282556 A1    Dec. 6, 2007

(30) Foreign Application Priority Data

Mar. 5, 2004    (AU) ............................. 2004901189
Jul. 7, 2004    (AU) ............................. 2004903723

(51) Int. Cl.
*G01P 21/00*  (2006.01)

(52) U.S. Cl. ........................ 702/108; 702/117; 702/188; 702/189

(58) Field of Classification Search ................... 702/58, 702/59, 19, 24, 108, 113–115, 123–126, 702/117–120, 176–178, 183, 188, 189, 185; 324/537, 555; 703/13–15, 19

See application file for complete search history.

(56) References Cited

U.S. PATENT DOCUMENTS

| 5,623,545 | A  | * | 4/1997  | Childs et al. ................... 380/2 |
| 5,633,879 | A  | * | 5/1997  | Potts et al. ................... 714/738 |
| 5,642,057 | A  | * | 6/1997  | Oke et al. .................... 324/763 |
| 5,796,750 | A  | * | 8/1998  | Lottridge et al. ............ 714/725 |
| 5,920,830 | A  | * | 7/1999  | Hatfield et al. .............. 702/119 |
| 6,334,121 | B1 | * | 12/2001 | Primeaux et al. .............. 706/62 |
| 6,950,771 | B1 | * | 9/2005  | Fan et al. ..................... 702/117 |
| 2005/0060621 | A1 |   | 3/2005  | Lee et al. |
| 2005/0262399 | A1 | * | 11/2005 | Brown et al. .................. 714/38 |

FOREIGN PATENT DOCUMENTS

| WO | WO0067164   |    | 11/2000 |
| WO | WO 03/048794 | A1 | 6/2003 |

OTHER PUBLICATIONS

"Search Report for International Application No. PCT/AU2005/00313", (Apr. 6, 2005).

* cited by examiner

*Primary Examiner*—Eliseo Ramos Feliciano
*Assistant Examiner*—Mi'schita' Henson
(74) *Attorney, Agent, or Firm*—Schwegman, Lundberg & Woessner, P.A.

(57) ABSTRACT

An embedded device testing system for comparing actual device under test input/output vector pairs with modelled device under test input/output vector pairs, wherein actual device under test output vectors are sampled in accordance with a predefined timing reference.

7 Claims, 3 Drawing Sheets

Fig 1

Figure 2 Generic Execution Engine Architecture

| Input Port1 | Input Port2 | Input Port3 | output Port4 | Output Port5 | Output Port6 |
|---|---|---|---|---|---|
| $x_1$ | $y_1$ | $z_1$ | $a_1$ | $b_1$ | $c_1$ |
| $x_2$ | $y_2$ | $z_2$ | $a_2$ | $b_2$ | $c_2$ |
| $x_3$ | $y_3$ | $z_3$ | $a_3$ | $b_3$ | $c_3$ |
| $x_n$ | $y_n$ | $z_n$ | $a_n$ | $b_n$ | $c_n$ |

Fig 4

TESTING OF EMBEDDED SYSTEMS

CLAIM OF PRIORITY

This application is a U.S. National Stage Filing under 35 U.S.C. 371 from International Patent Application No. PCT/AU2005/000313 filed Mar. 4, 2005, and published in English as WO 2005/085888 A1 on Sep. 15, 2005, which claims priority under 35 U.S.C. § 119(a)-(d) or 365(b) of Australian Application Nos. 2004903723 filed Jul. 7, 2004 and 2004901189 filed Mar. 5, 2004, which applications and publication are incorporated herein by reference.

FIELD OF INVENTION

The present invention relates to the field of embedded or distributed systems. In one form, the present invention relates to a method and apparatus for the testing of embedded devices. It will be convenient to hereinafter describe the invention in relation to the use of a method and apparatus employing, in part, CASE (Computer Aided Software Engineering) tools to model the behaviour of an embedded device or system referred to herein as a Device Under Test (DUT), however it should be appreciated that the present invention is not limited to that use, only.

BACKGROUND ART

Throughout this specification the use of the word "inventor" in singular form may be taken as reference to one (singular) or all (plural) inventors of the present invention.

The inventor has identified and considered the following technologies.

In general, an embedded system is a system within a larger system. Embedded systems may be implemented on a single integrated circuit or as scaled-down software code. Alternatively, embedded systems may comprise analog components. An embedded system typically has a specialized function with programs stored on ROM. Examples of embedded systems are chips that monitor automobile functions, comprising engine controls, antilock brakes, air bags, active suspension systems; industrial process devices, for example comprising robotic systems in production engineering applications or medical applications; environmental systems, comprising pollution monitoring devices etc; entertainment systems and; property protection systems, comprising for example security devices, fire prevention or smoke detection devices and combinations thereof. Ordinarily, everything needed for those functions is custom designed into specific chips and, there may be no external operating system required. Many embedded systems are produced in the range of tens of thousands to millions of units. Reducing costs in all aspects of design to actual production, installation and maintenance is therefore a major concern. There may be many different CPU architectures used in embedded designs. This contrasts with the desktop computer market, which is limited to only a small number of competing architectures, such as, Intel™'s x86, and the Apple™/Motorola™/IBM™ PowerPC™. A common configuration for embedded systems is the "system on a chip", an application-specific integrated circuit. It is also notable that user interfaces for embedded systems vary to a large extent. The resultant complexity of most embedded systems requires that generally they are developed in teams by several developers at the same time using different computer platforms. Furthermore, high performance micro-controllers which are now available may provide developers with highly complex software solutions for embedded system design. Managing the complexity of software components and their inter-workings has therefore also become a major concern.

Rational™ Robot is a PC application designed for the design and execution of tests on PC applications. Therefore, in an attempt to provide a test environment for embedded systems by use of Rational™ Robot, a Data Driven Engine (DDE) is required to deal with the complexity of generating tests within a PC environment and translating those tests into a syntax that may be interpreted by additional interface hardware.

Visio™ is an application where a message sequence chart (msc) representing a test case or sequence may be constructed and then via interfacing Visual Basic code representing the Visio™ msc to Labview™, a graphical programming language tool. The Labview™ functions may then interpret this code and execute the test on a DUT. It is to be noted that Labview™ being the programming environment, still needs to interface physically and logically to the DUT via specific I/O hardware. There is also an issue of having to reconstruct from scratch the entire msc every time there is a change to the underlying test sequence requirements.

A product from Lucent™ known as UBET employs an enhancement of msc's, namely, HMSC (Hierarchical Message Sequence Charts). The limitations of the Visual Basic scripts are removed in this implementation, however, the inventor has identified that there still remains the issue of reconstructing from scratch the MSC's and HMSC's with every iteration in requirements or change in requirements of a test sequence for embedded systems.

Generally, "black box" test environments do not exist for embedded systems, in particular, systems that are not built on or do not employ industry standard communications protocols. In a niche market, such as is filled by the fire and smoke alarm products developed by Vision Fire & Security Pty Ltd and marketed under trade marks such as VESDA®, the communications protocols are developed in house and are not serviced by major industry developers of automation systems, for example, such as TTCN2 and TTCN3. Thus, it is considered that there is little or no means in existence to leverage off the activity of cooperating industries and user groups.

In general, test automation environments such as Rational™ Robot are contemporaneous with other automation environments such as WinRunner™ and other PC and GUI focused applications. The inventor has identified that these environments are designed in a manner, which may not communicate with, stimulate, or control embedded systems. The inventor has further identified that attempts to retrospectively adapt these environments through the addition of interpreters or hardware interfaces necessitates very large efforts in terms of scripting and definition of key words and phrases. Moreover, the inventor has identified that test designing within these environments requires repetitive manual labour. Overall, the inventor has identified use of these environments to be time consuming, difficult to maintain and labour intensive in generation and updating and, unable to adequately deal with any changes in requirements and project scope.

The inventor has further identified that, under such environments, bridging the divide from formally defined tests to physically interfacing to a product that is controlled via embedded software and automatically executing tests introduces difficulty given that very few user accessible interfaces are generally available for stimulus and reading of responses from embedded DUTs.

Any discussion of documents, devices, acts or knowledge in this specification is included to explain the context of the invention. It should not be taken as an admission that any of that material forms a part of the prior art base or the common general knowledge in the relevant art in Australia or elsewhere on or before the priority date of the invention disclosed herein, being the subject of the appended claims.

An object of the present invention is to provide functional tests for embedded systems at a system-wide or black box level in a manner that is responsive to changing test requirements.

A further object of the present invention is to alleviate at least one disadvantage associated with the prior art, or at least provide a useful alternative.

SUMMARY OF INVENTION

In one aspect the present invention provides a logical connection port for an embedded device testing system, the testing system comprising apparatus adapted to compare actual device under test (DUT) input/output vector pairs with modelled DUT input/output vector pairs, wherein the logical connection port is adapted to indicate a predefined timing reference for determining a point in time at which to sample an output vector as the corresponding output vector in an input/output vector pair.

The sampled output vector may be a modelled or actual output vector of one or more of:
  a smoke detector;
  a fire detector;
  a security device;
  a medical device;
  a biological tissue processing device;
  an industrial process device.

In another aspect, a preferred embodiment of the present invention provides a method of testing at least one embedded DUT comprising the steps of:
  a) determining a test configuration parameter set comprising predefined DUT test sequence rules;
  b) determining a first data set comprising input test vectors based on the test configuration parameter set;
  c) processing the first data set in a DUT model to determine output test vectors wherein the output test vectors comprise DUT model generated responses to the input test vectors;
  d) processing the first data set and the output test vectors to determine a second data set comprising pairs of stabilised input and output test vectors;
  e) communicating the stabilised input test vectors to at least one DUT via a DUT independent interface so that the at least one DUT is stimulated by the stabilised input test vectors to produce DUT output vectors;
  f) determining a third data set comprising the stabilised input vectors and corresponding DUT output vectors;
  g) comparing the third data set with the second data set to determine a comparison of actual behaviour to modelled behaviour of the at least one DUT.

Step d), above, may further comprise the steps of:
  h) parsing the output test vectors with the first data set in accordance with a predefined timing reference in which the predefined timing reference determines a point in time to sample an output test vector as a stabilised output test vector;
  i) matching each stabilised output test vector to a corresponding input test vector to form pairs of stabilised input and output test vectors.

The predefined timing reference may be derived from a logical connection port as described above. Further, the predefined timing reference may comprise one of:
  one delay period common to all input test vectors, and;
  a predetermined delay period for each input test vector.

The DUT independent interface may comprise an interprocess communication protocol utilising one of:
  TCP/IP;
  Active-X;
  any serial communications standards, which may comprise synchronous or asynchronous data transfer such as, for example, RS232(EIA-232), RS485, USB (Universal Serial Bus). Other protocols may also be utilised as would be recognised by the person skilled in the art.

The DUT model may comprise one or more of the following abstraction techniques:
  architectural level descriptions;
  data type definitions;
  state transition diagrams;
  extended Message Sequence Charts.

The data sets described above may comprise test vector formatted files.

The test configuration parameter set described above may comprise a test parameter configuration file.

The DUT may comprise one or more of:
  a smoke or fire detector;
  a security device;
  a medical device;
  a biological tissue processing device;
  an industrial process device.

In yet another aspect, a preferred embodiment of the present invention provides apparatus adapted to test at least one embedded device (DUT), said apparatus comprising:
  processor means adapted to operate in accordance with a predetermined instruction set,
  said apparatus, in conjunction with said instruction set, being adapted to perform the method steps as described herein.

In still another aspect, a preferred embodiment of the present invention provides a generic test execution engine for testing at least one embedded DUT comprising:
  a test vector interface comprising parsing means for parsing modelled output test vectors with predefined input test vectors in accordance with a predefined timing reference to determine a test vector file comprising pairs of corresponding stabilised input and output test vectors;
  a DUT interface comprising addressing means for addressing, via data ports, test vectors to respective DUT's in accordance with an address identifier within the test vector file, and communication means for receiving DUT output vectors in response to the test vectors;
  a test result interface comprising processing means for processing respective pairs of stabilised input and output test vectors and corresponding received DUT output vectors. As noted above, the predefined timing reference may be derived from a logical connection port as described herein. The predefined timing reference may determine a point in time to sample an output test vector in order to be determined as a stabilised output test vector for a corresponding input test vector.

The generic test execution engine as described herein may be utilised for testing at least one DUT wherein the at least one DUT comprises one or more of:
  a smoke or fire detector.
  a security device;
  a medical device;
  a biological tissue processing device;
  an industrial process device.

In a preferred embodiment of the present invention an embedded device testing system is provided comprising:

a generic test execution engine as described herein; and, logging means operatively associated with the test result interface for recording an indication of a comparison between respective pairs of stabilised input and output test vectors and corresponding received DUT output vectors. The recorded indication may comprise a formatted file comprising the following fields:

DateTimeStamp;

Evaluated Result;

A Binary String representing a logical comparison of each port value between respective test and DUT output vectors;

Port Identifier;

Port value comprising one of matched port value and expected value/actual value.

In still a further aspect, a preferred embodiment of the present invention provides a data format for use in an embedded DUT testing system, the data format comprising an input test vector field correspondingly paired with an output test vector field wherein:

the input test vector field comprises predefined input information;

the output test vector field comprises stabilised output information determined by sampling output information, provided in response to corresponding predefined input information, at a point in time determined by a predefined timing reference. The predefined timing reference may be derived from the predefined input information. Further, the predefined input information may comprise command set input data and the predefined output information may comprise command set output data.

In yet a further aspect, a preferred embodiment of the present invention provides an embedded DUT testing system data file comprising a data format as herein described.

In still another aspect, a preferred embodiment of the present invention provides a data transmission packet format for use in an embedded DUT testing system comprising a data format as herein described.

In yet another aspect, a preferred embodiment of the present invention provides a computer program product including:

a computer usable medium having computer readable program code and computer readable system code embodied on said medium for testing at least one embedded DUT within a data processing system, said computer program product comprising:

computer readable code within said computer usable medium for performing the method steps of a method as herein described.

In accordance with one aspect of the present invention, there is provided an embedded device testing system for comparing actual device under test input/output vector pairs with modelled device under test input/output vector pairs, wherein actual device under test output vectors are sampled in accordance with a predefined timing reference.

Preferably, the predefined timing reference includes a predetermined delay period for each one of said actual device under test input test vectors. Preferably, the predetermined delay for each one of said actual device under test input test vectors is substantially the length of time before the corresponding output vector stabilises.

In accordance with another aspect of the present invention, there is provided a process for testing an embedded device under test, including the steps of: comparing actual device under test input/output vector pairs with modelled device under test input/output vector pairs, wherein actual device under test output vectors are sampled in accordance with a predefined timing reference.

Preferably, the predefined timing reference includes a predetermined delay period for each one of said actual device under test input test vectors.

Preferably, the predetermined delay for each one of said actual device under test input test vectors is substantially the length of time before the corresponding output vector stabilises.

In accordance with another aspect of the present invention, there is provided apparatus for testing a device under test, including:

(a) means for applying a test input vector to the device under test; and (b) means for sampling an output vector from the device under test in response to said input vector, wherein the wherein said sampling is effected in accordance with a predefined timing reference.

Preferably, the predefined timing reference includes a predetermined delay period.

Preferably, the predetermined delay is substantially the length of time before the corresponding output vector stabilises.

In essence, the present invention stems from the realisation that determining stabilised output data by, for example, providing a predefined timing reference to determine a point in time in which to sample or accept a given output, of either a modelled DUT or an actual DUT in response to a given input, allows for a realistic evaluation of the behaviour (modelled or actual) of a DUT, which is constrained to operate in a real environment. Determining realistic or stabilised output allows reliable test vectors to be determined much sooner than in the case of an ad hoc approach to determining the output data corresponding to a given input. The stabilised output data may then be combined with its corresponding input data to provide a data format with which to interface, drive and subsequently test a plurality of DUT's. The plurality of DUT's may be multiples of the same DUT or alternatively, multiple DUT's being different devices whether they provide the same function or not. In a preferred embodiment of the invention, one or a plurality of the same DUT, eg a fire detection device, is/are subjected to the same or different tests.

The present invention has been found to result in a number of advantages, such as:

Rapid prototyping of the functionality and behaviour specified for new products

Dynamic interaction with the DUT model results in early detection of requirement defects Based on supplied user (test engineer) defined or handcrafted configuration files containing test sequence rules, an almost unlimited number of tests and results can be automatically generated based on the DUT model behaviour There is no reliance on or need for Data Driven Engines or similar as all necessary variable names are maintained from within the model and linked to an automation harness that logically interfaces with the DUT. In this context, an automation harness may comprise a software construct for performing the function of interfacing the DUT with given input test data. The harness may be implemented in C, C++, Java or, any suitable programming language, for example, PERL that would be recognised by the person skilled in the art as suitable for that purpose.

Automatic execution of the resultant executing test vector sets, which may be in the form of Execution Test Data Files (ETDF's when employing the Autofocus™ modelling tool, described below) via a graphical programming language interface to one or more I/O devices and subsequent reporting is automatic Parsing and checking for differences between model predictions and actual results is automatic Increased requirement/feature interaction (test sequence/rules) coverage Increased behavioural tests Speed of test execution and reporting Elimination of human interaction during automated test execution Improved repeatability in, for example, regression test execution Facilitation of complete regression test execution of all generated tests at minimal expense The inventor considers one major benefit or advantage of the invention is the automation of all manual, time intensive, tedious and error prone test generation and execution tasks. Moreover, advantageously, the present invention provides physically executable vectors (derived with the use of modelling tools) that can be processed through a real world device to provide reliable test data.

Other aspects and preferred embodiments are disclosed in the specification and/or defined in the appended claims, forming a part of the description of the invention.

The scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

Further disclosure, objects, advantages and aspects of the present invention may be better understood by those skilled in the relevant art by reference to the following description of preferred embodiments taken in conjunction with the accompanying drawings, which are given by way of illustration only, and thus are not limiting to the scope of the present invention, and in which.

DETAILED DESCRIPTION

By way of background, a number of terms are here defined.

DUT: Device Under Test. A target embedded device or, an embedded system comprising one or more embedded devices that is the subject of tests. Furthermore, a DUT may comprise one or more embedded systems being the subject of tests.

Model: An approximation of selected aspects of the behavioural characteristics of a real-world embedded DUT and real world influences on the embedded DUT. A model may use Architectural Level Descriptions (ALD) or Definitions, State Transition Definitions, Message Sequence Charts (MSC's), Hierarchical Message Sequence Charts (HMSC's), Extended Message Sequence Charts (EMSC) and Data Type Definitions to provide an abstract representation of the physical interface, real world environmental influences and constraints upon an embedded DUT.

Output Port: An output port is used in a model to represent a physical output on the DUT being modelled. The physical outputs of a DUT may comprise LED's, relay contacts, Open Collector, Wet or Dry Outputs, Communications Ports, for example, RS-232 employing ADCP etc, and Ethernet Ports.

TVF: Test Vector File. A formatted ASCII text file containing Test Vectors generated based on definitions contained in a test configuration file (TCF). There may be two versions of a TVF utilised in embodiments of the present invention, an input test vector only TVF and a input/output test vector (response) TVF created when the input only test vector TVF is passed through the model.

Test Vector: An ordered set of input, output, or input and output values defining input and/or output information. For example a test vector may comprise a line within a TVF representing a command set of inputs or input/outputs.

Test Vector Pair: A Test Vector pair is the same as a test vector, however, the outputs represented are valid at that point in time indicated by the value of a predefined timing reference provided in accordance with embodiments of the present invention. The predefined timing reference may be provided by way of a Timing Port.

Clock Pulse: A clock pulse is an arbitrary but fixed timing period employed by a device model to synchronise activity within the model resulting in propagation of variables and transition firing. The period of time within the model during which inputs are sensed, calculations computed and outputs generated.

Config Port: A port that is used by a test engineer/test designer to identify for the automated execution engine of an embodiment of the present invention that the parameter associated with the port is a configuration parameter and should be applied before any stimulus is applied to the input ports.

GEE: A Generic Execution Engine in accordance with an embodiment of the present invention.

Execution Port: A port that is used by the GEE to initiate and maintain communication with a DUT Specific Interface.

TCF: Test configuration file. A set of instructions that define the configuration parameters, stimuli parameters (patterns), the permutation and combinations of all input ports with port input patterns, test repetition rates and test group repetition rates, and the definition of the explicit test cases under the preceding settings which results in the generation of input (stimuli) test vectors associated with input only test vector sets, which may be in the form of test vector files (TVF's). The TCF therefore effectively comprises the test sequence rules. By way of illustration, the Autofocus™ modelling tool provides for the creation of GCF's (Group Configuration Files), which may be viewed as a test sequence configuration facility. However, the TIG (Test Input Generator), used to create GCF's in Autofocus™, is unable to produce configuration files for floating models using floating point arithmetic. The TCF's of the present invention provide for what is known in graph theory as a "guided tour". That is the State Transition Diagram of a model is considered as a graph through which the execution of test sequences is guided in such a manner as to directly influence and control the mode and manner in which testing progresses. As a result, the present invention may be in control of what gets tested, how it gets tested and to what degree (coverage) it is tested. This features is not a natural consequence of the GCF from an Autofocus™ TIG, where a GCF will result in a random unguided mode of execution.

Input Port: An input port is used in a DUT, and in particular a DUT model to represent a physical input on the DUT being modelled.

Timing Port: A port that is used by the test designer to indicate to the automated execution engine at what time, in accordance with a predefined timing reference, to sample the outputs of the DUT (modelled or actual) for matches of stabilised output vectors with corresponding input vectors. Furthermore, in the case of obtaining outputs from an actual DUT when provided with the input vector (which has a corresponding model generated output vector) the DUT output is sampled for the output vector or response, which is then compared against the model generated output vector of the same input vector. The DUT response may therefore be determined for its equivalence to that of the model for the same stimuli. The Timing Port is a port that doesn't necessarily exist on the DUT. The execution engine executes a wait period determined by the predefined timing reference indicated on the timing port directly after applying stimulus to the input port.

Figure 1:
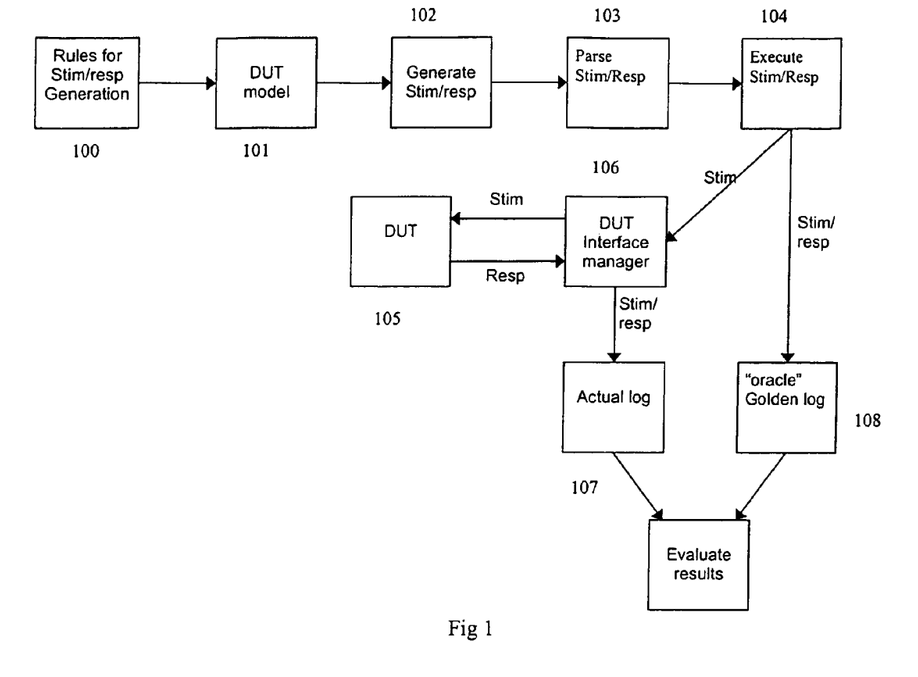
FIG. 1 is a block diagram schematically illustrating an automated model architecture and test environment in accordance with an embodiment of the present invention.

With reference to FIG. 1, an automated modelling and test environment 10 is now generally described as it relates to a preferred embodiment of the present invention. Dynamic, executable and configurable abstracted models 101 are created from which are derived responses corresponding to input stimuli 102. The models are predicated on specific test sequence rules 100 in the form of test configuration parameter sets, which may be embodied in the form of a test configuration file TCF as defined above. Generally speaking, the appropriate pairing by means of parsing 103 the input stimuli to stabilised output response of a model in accordance with an embodiment of the present invention provides, in a sense, a test oracle 108 for reference against actual DUT 105 behaviour. A test oracle 108 as such, in the context of this specification, provides a means by which the dynamic behaviour of an embedded device/system under test DUT 105 may be dynamically interacted/interfaced 106 with and interrogated and from which a priori knowledge of potential responses to input stimuli may be derived. The resultant sets or files of input to stabilised output may be retained in a "golden log" or oracle 108 as a prediction against which the actual responses 107 of the DUT 105 for the same stimuli 104 may be evaluated by a comparison 109 and from which a deviation from expected behaviour based on the original test sequence rules/requirements set of the actually implemented devices may be observed. From a separate file that only has input or stimuli vectors a drive TVF file may be created 104 and used to drive an in an interface environment 106 or harness that provides the electrical and control interfaces to the device(s)/system(s) under test, DUT 105. By means of capturing the actual device under test responses to the input stimuli derived from the model as described above, an output file or log 107 of stimuli to response may be generated. This actual output file may then be compared 109 to the "golden file" of input to output derived from the model, namely, the test oracle 108. Suitable scripts, for example, written in Perl or Labview™ elements may implement the comparison. The differences identified by this comparison may be noted and investigated for defects within: the implemented DUT 105; defects in the requirements 100; or, defects in the test environment generally.

The testing environment 10 of embodiments of the present invention rather than requiring manually hand crafting test sequences based on individual requirements in a very static sense which then need to be associated with a unique data driven engine or similar and automation of test through a GUI based engine testing design is instead based on dynamic behaviour expressed in a model 101 that may be interacted with. Hence test design may be a by-product of interacting with a model 101 that encapsulates the essence of the behaviour of the device or product in question DUT 105. By providing a model 101 with a series of inputs, the model produces outputs that are predictions of the actual behaviour of the actual DUT 105. Thus by appropriate application of input vectors in accordance with the present invention and generating tests, small to extremely large sets of tests can be quickly generated. In a preferred embodiment of the present invention, it has been identified that generation of tests per se may be provided by commercial products such as Autofocus™, Reactus™, Simulink™ (where Simulink™ is a Matlab™ toolbox) and other such products that would be known to the person skilled in the art. Further, the present invention limits, in a crude but effective way, the domain space explosion inherent in combinatorial generation through Autofocus™ by explicitly crafting the parameters (within a TCF) that represent the input domain carefully so as to minimise this domain explosion. It is a crude approach in as much as it may be reliant on the knowledge of the test designer. Other solutions to the domain state explosion caused by combinatorial effects have been postulated, this includes application of CLP (Constraint Logic Programming) techniques, model proving tools such as SATO etc. However all these solutions so far reside very heavily in the research domain and have not yet made an effectual transition to industrial practice. Maintaining a record of tests is resolved by recognising that a model 101 may be used as the repository of the behaviour that gave rise to the tests generated. By altering the model 101 to keep pace with changing requirements 100 and reusing the input stimuli, all tests may be updated as required with almost no human interaction. In a straightforward approach, the model is an abstraction that is moulded to represent the DUT behaviour in question. The GEE and DSI's (Device Specific Interfaces) have knowledge of the terms and parameters and ports employed by the model. As long as the model does not change the implementation of these terms, parameters, ports etc. then there may be no issue. If changes are made in the model by the amendment of STD's, SSD's etc then the GEE and DSI's need to be amended to account for this change. This may be implemented, for example, in Labview™. By execution of tests 104 through, for example a Labview™ environment, with automatically based sets of stimuli and capturing the output results for automatic comparison with predicted output again eliminates or reduces dramatically human interaction.

Given that models are re-usable then the reuse of model components is conducive to speeding up development of new models for new products DUT's that may be of the same technology family. Models are reusable in the sense that if the behaviour exhibited by the model or a component of the model is consistent with the behaviour intended by a new or different implementation of a DUT for which the original model was designed, then it is possible to re-apply elements of the model directly or after some minor amendment. As noted above, in accordance with a preferred embodiment, state based behavioural models are created in a modelling environment 101 such as Autofocus™, or for example, Matlab™. A handcrafted or user defined 100 Test Configuration File (TCF) is parsed through the model preferably in a compiled C version which is an executable giving rise to a Test Data Format (TDF) file, in the Autofocus environment or more generally, a Test Input File (TIF), which represents the input test vectors generated based on the information contained in the TCF and which may generally correspond to a TVF. Hereinafter, for convenience the Autofocus TDF will referred to for clarity of description. This TDF of input only stimuli (test vectors) which comprises the same input set of stimuli as the golden set is generated and parsed, time stamped, filtered and formatted and the resultant TDF from this process is utilised to drive 104 an automation test interface 106 developed, preferably in a Labview™ environment. Alternatively other modules could provide the same functionality that Labview™ provides, namely a programming environment per se, for example, an ADA test environment. Labview™ conveniently has associated with its programming environment, off the shelf I/O solutions that comprise drivers that facilitate direct integration with the Labview™ applications. It is, however, possible to develop a similar solution in ADA, C, Perl etc. A separate TDF is generated, which comprises input vectors (stimuli) to output vectors (responses) generated by the model based on the behaviour represented by the model. The resultant TDF described here is retained as the golden set of test input 108 to test data against which the output 107 of the DUT 105 will be compared. In a preferred embodiment Labview™ Virtual Instruments (VI's) are developed 106 that are DUT 105 specific retaining knowledge of the unique port names and variables utilised in the model and have knowledge of the specific command language of the DUT 105. Physical interfacing to the DUT 105 may be via specific I/O cards. The VI's may be controlled and coordinated by a master VI or test "manager" 106. The master VI has the task of controlling the timing and execution of the tests as represented in the parsed and filtered TDF, or drive TDF (DTDF) mentioned earlier. By reading the input vectors represented in the DTDF the VI's generate the appropriate electrical stimuli necessary to stimulate the inputs of the device DUT 105 and to configure it. The outputs of the DUT 105 are subsequently monitored and the responses recorded 107. A log or execution TDF (ETDF) in a format consistent with the DTDF is consequently generated through the course of the test execution. Post test execution the DTDF and ETDF may be automatically compared 109 via an appropriate script or in a Labview™ environment. The differences in response from the actual DUT output as compared to that of the original TDF from the compiled model or oracle 108 are flagged as potential defects or deviations from expectations based solely on the original product function and performance requirements.

Parsing of a TDF File

Below is an example of an output TDF file after an input only TDF has been passed through a model. The preferred format of the TDF below is <input port >?<pattern>; . . . <output port>!<pattern>;

in this example Ports 1-3 are input ports and Ports 4-6 are output ports.

Port1?x;Port2?y;Port3?z;Port4!;Port5!;Port6!;

. . .

Port1?x;Port2?y;Port3?z;Port4!a;Port5!;Port6!;

. . .

Port1?x;Port2?y;Port3?z;Port4!a;Port5!b;Port6!;

. . .

repeated n number of times as the input vectors are passed through the model

. . .

Port1?x;Port2?y;Port3?z;Port4!a;Port5!b;Port6!;

. . .

until eventually all of the output ports (represented by <portname>!<value>) are populated.

. . .

Port1?x;Port2?y;Port3?z;Port4!a;Port5!b;Port6!c;
Port1?x;Port2?y;Port3?z;Port4!d;Port5!b;Port6!c;
Port1?x;Port2?y;Port3?z;Port4!a;Port5!b;Port6!c;

. . .

however, even at the point of populating all output ports, the values contained therein may change in the time it takes to clock through the entire model. This may vary dependant upon how the model was implemented, that is, variation may be dependent on the nature of the device being modelled. For example, a smoke detector will not immediately produce a true output value at the time a stimulus is provided at its input. However there will come a time when the output stops changing becoming a stabilised output and it is this vector that must be used to model and test the device.

. . .

Port1?x;Port2?y;Port3?z;Port4!a;Port5!b;Port6!c;
Port1?x;Port2?y;Port3?z;Port4!a;Port5!b;Port6!c;
Port1?x;Port2?y;Port3?z;Port4!a;Port5!b;Port6!c;
Port1?x;Port2?y;Port3?z;Port4!a;Port5!b;Port6!c;
Port1?x;Port2?y;Port3?z;Port4!a;Port5!b;Port6!c;
Port1?x;Port2?y;Port3?z;Port4!a;Port5!b;Port6!c;

Eventually a point in time arrives when the outputs have stabilised and a matching input and output vector (a vector pair) may be attained. The issue is at what point in time after the input stimulus is applied will the output be valid? A number of different methods have been employed by the inventor as follows:

1. Wait a fixed period of time—this may prove to be quite inefficient and relies on the fact that each test vector pair doesn't rely on what state the last vector pair left the system in. In a working system this was flawed because it didn't allow the model designer—the true test engineer—to create sequence's (inter linked vector pairs)

2. Wait until the actual outputs satisfy a predefined match of the vector pair. This is also flawed because it requires waiting until the output matches. However, it is usual to employ some kind of time out in this situation otherwise if the outputs never match, there will be no progressing through the remainder of the vector pairs. Employing a timeout has the same symptoms as those in 1 above.

3. Count the number of lines within a TDF before the Test Vector pair and use that to determine the time before the outputs are valid. This is may not be valid since the number of test vectors will vary based upon the implementation of the model. Two models of the same DUT may be implemented in different ways that will require a different number of clock pulses to generate the same test vector pair.

4. Have the test vector indicate a predefined period of time before it's output vector is valid. This is in essence achieved by creating extra timing ports, for example, in the model. The timing ports indicate to the automated execution engine what period of time to wait before sampling the outputs of the system under test. This underlies a preferred embodiment of the present invention.

Generic Automated Test Execution

It is desirable to implement an execution engine in a generic fashion that allows the re-use of the same architecture across multiple products and projects, DUT's. This requires a test execution engine that doesn't have any knowledge of the DUT or the interface executing the test.

Figure 2:
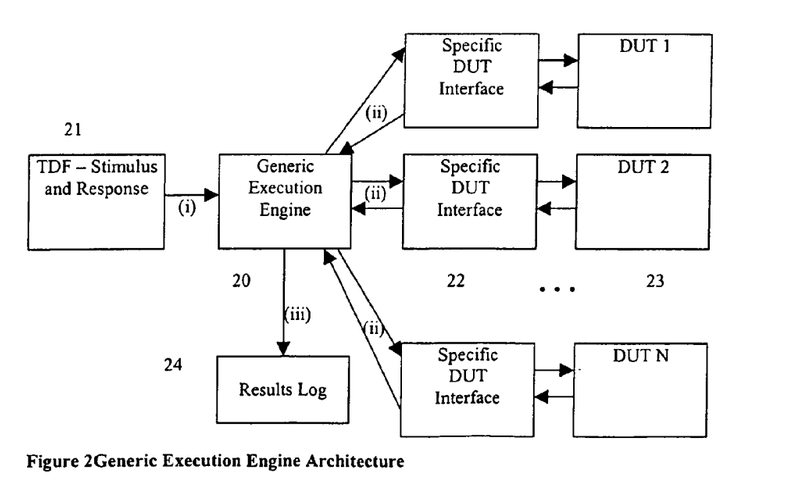
FIG. 2 is a block diagram schematically illustrating an architecture of a generic test execution engine in accordance with an embodiment of the present invention.

Executing automated tests involves a number of steps,
Configure DUT
Start test on DUT
Implement a system "Wait" for a period time until outputs can be verified
Measure output values
Evaluate results against the expected values.
Generic Execution Engine Architecture The architecture of the Generic Execution Engine (GEE) 20 in accordance with a preferred embodiment is shown in FIG. 2. This architecture 20 supports either multiples of the same DUT 23 to facilitate parallel test execution or different DUT's 23 being tested simultaneously.

A number of advantages are provided by the GEE 20 firstly, it allows for accelerated life tests, greater test coverage in the same period of time, independent testing of multiple DUT's or multiple instances of the same DUT. A further advantage is in terms of reliability, ie should one DUT fail it is independent of all other DUT's and tests being executed on them.

The architecture for the GEE 20 details a number of interfaces (i) TDF-GEE Interface
(ii) GEE-DUT Interface
(iii) GEE-Result Log Interface
TDF-GEE Interface (i)

The TDF-GEE interface resides between the GEE 20 and model generated TDF files 21. This interface provides the function detailed above in relation to the parsing of a TDF file.

GEE-DUT Interface (ii)

This is a communication interface utilising TCP/IP in a preferred embodiment. However, any other interprocess communication method may be employed such as, for example, Active-X comprising for example, DCOM or COM. The socket address for a given DUT 23 is identified by a TCP/IP_Address port, which is preferably contained in a TDF 21.

The GEE 20 manages the GEE-DUT interface and provides the following services to DUT specific Interface(s) 22, (i) Test Vector Pair—provide the test vector pair to the DUT specific Interface 22

(ii) Restart Test—Re-send test vectors starting from the first test vector pair in the TDF 21

(iii) Add result to log 24—DUT specific Interface 22 provides test vector pair and resultant vector pair for processing by GEE to provide formatted actual data to results log 24

GEE-Result Log Interface (iii)

The format of the Result Log 24 is an ASCII format file. The file name used may be generated by concatenating together the value of the DUT 23 port in the TDF 21 and a time and date stamp.

In this example, the file contains data formatted in the following way,

DateTimeStamp,
Evaluated result +++=PASS,
   ++-=PASS (masked port failure encountered)=
   ---=FAIL,
    ***=Error encountered during test Binary String representing a logical comparison of each port value between the Test Vector Pair and Resultant Vector Pair. The user is able to mask the comparison of any ports that they choose, Each port is listed and if the data matches only one value is shown. Otherwise, if values don't match then the expected value is presented first followed by the actual value.

Figure 3A:
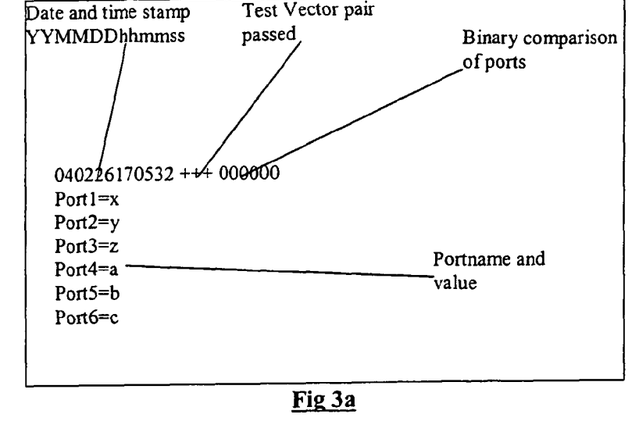
FIG. 3a illustrates an example file showing the results of a comparison between modelled device behaviour and actual device behaviour wherein a device has passed an automated test in accordance with an embodiment of the present invention.
Figure 3B:
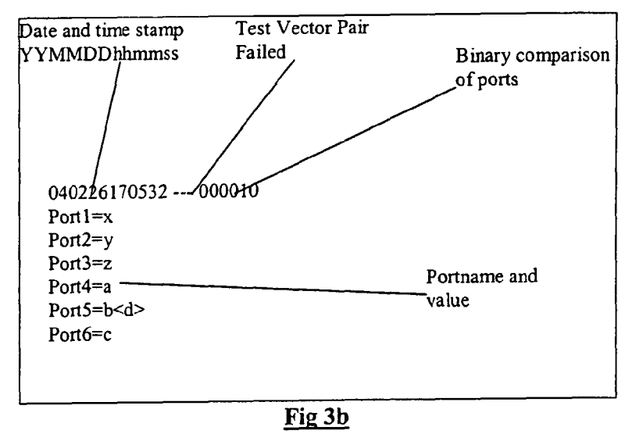
FIG. 3b illustrates an example file showing the results of a comparison between modelled device behaviour and actual device behaviour wherein a device has failed an automated test in accordance with an embodiment of the present invention.
Figure 3C:
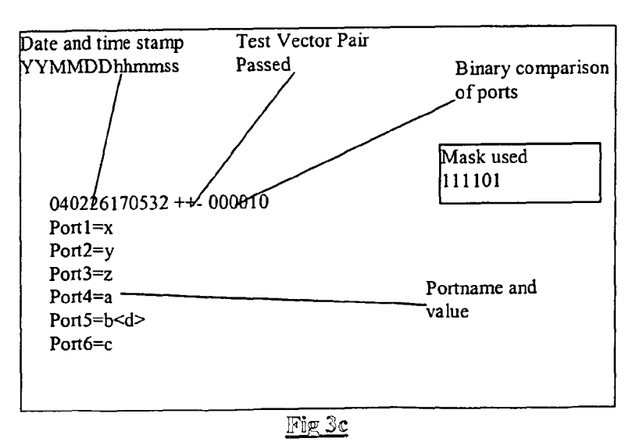
FIG. 3c illustrates an example file showing the results of a masked comparison between modelled device behaviour and actual device behaviour wherein a device has passed an automated test in accordance with an embodiment of the present invention.

Examples of each sequence Results Log file described above are shown in FIGS. 3a to 3c, respectively.

Further elaboration of the present invention follows.

Test Generation

The inventor defines a test as A set of preconditions, stimuli, and expected responses or outcomes so arranged as to achieve the objective of exercising a function or behaviour to verify compliance with a requirement specification.

In a preferred embodiment our implementation ensures that a measure of control is maintained in the test generation and this may be achieved by opting to craft the values chosen. It may be understood that judicious selection of equivalence class partitions and inclusion of all product/device presets and preconditions is an exercise that may provide a meaningful set of parameters to generate the stimuli. The parameters identified are employed in the combinatorial test vector generation in order to tailor the "flavour" of the vectors generated. This is done in order to ensure that specific state transitions or particular state machines are covered in very explicit fashion under directed control. The reason for this is that in many instances there may be a time order implicit in the behaviour we wish to test.

Once the test vectors are generated we may ensure that groupings are created that provide for specific modes of execution. It is desirable that during automatic execution to ensure that certain events have occurred in a particular order for registers to be set and local variables to be updated for tests to have significance or meaning.

The result of the automatic test vector generation activity is a set of stimuli we call the input Test Vector Files, as described above.

To generate the actual tests involves passing the input Test Vector Files (TVF's) through the model that possesses dynamic behaviour and capturing the output, which typically is a paired Input/Output Test Vector File.

The automatic test generation circle is closed at this point. The effective result is that the model becomes an oracle or predictor of the product behaviour, directly providing the "expectation" element of the "test" definition above.

The Path to Automatic Execution

To achieve automatic execution it is considered that this requires that once the model has been run under simulation and the output TVF generated, the input TVF is parsed through the automation infrastructure of the present invention. The actual physical product under test is subsequently stimulated by the same set of test vectors as the model although now employing a test harness to provide the electrical and mechanical interfaces to the real world environment. The product responses are captured and logged. These product responses are compared to those produced by the model earlier and any deviations are noted for investigation.

Metrics

The chosen metrics show that approximately as much time is spent developing the model as would be spent in developing manual tests for the same functionality. The difference is that in return what we gain from the investment in building the models is:

Superior review capability of the originating requirements

Simulation capability to investigate dynamically the requirement interaction

Capability to generate phenomenal numbers of tests

A means to provide test vectors as a result of the latter that can be exploited by automation infrastructure Ease of maintenance in terms of rapid reaction to requirements change, models are re-usable and easily amended.

As models are easily amended so too the tests generated through those models are as easily and quickly regenerated to account for the changes Additional Benefits Employing a modelling tool constrains the activity to a highly structured and formal approach and the rigour of the approach forces the test engineer to critically analyse the requirements under consideration. This rigor as a consequence provides for highly effective review. In itself this formal review through the modelling approach has proven useful in identifying inaccuracies, inconsistencies and contradictions as well as conflicts in the original requirements documents.

In addition, the experience of the inventor has proven that actually interacting in a dynamic sense with a model provides additional benefits in as much as the potentially unwanted behaviour arising from strict adherence to the requirements can be, and has in many instances been, identified and exposed early enough to be corrected before actual implementation. In other words the test engineer through dynamic modelling creates a very early prototype of the product elements they are interested in and interacts with them in such a manner as to understand, appreciate and expose the nuances of the resultant behaviour.

Automatic Test Execution

Executing the Test

The automated test execution engine reads the TVF generated by the modelling environment as discussed earlier. The TVF contains the test vectors to be executed by the execution engine. In this file an entire test description is contained on one line.

<input port >?<pattern>; . . . <output port>!<pattern>;

This single line gives a complete definition for a test vector. It provides us with a complete set of configuration parameters and stimulus to drive the test. It also provides us with a complete list of expected responses, which we then compare with the actual results to evaluate the result.

As previously noted a limitation with the above format on its own is that it doesn't convey any timing information. To solve this the preferred embodiment of the invention provides timing ports, which the modelling environment uses to convey timing information to the execution engine. These timing ports don't represent physical ports on the DUT, but are virtual ports used specifically by the Execution Engine to schedule timed events during the execution of a test vector.

The following port types in this implementation may be defined as:

Configuration Port—This defines configuration parameters that map to physical parameters/inputs on the DUT.

Timing Port—Used to schedule the timed events during the execution of a test vector.

Stimulus Port—This port is physically mapped to an input on the DUT. In our case this port defines what stimulus is to be applied to initiate the test.

Output Port—These map to physical outputs on the DUT. For example these could be relay contacts, LED's, UI Display message, serial message or an analogue output.

The execution of a test is detailed in the flow chart of Table 1 showing the Execution Engine STD. The STD highlights the steps required at a macro level to execute a test vector:

1. Read Test Vector to obtain the entire Configuration, Stimulus, Timing and Output parameter information.

2. Configure DUT with configuration parameters identified by the Configuration Ports.

3. Stimulate DUT with stimulus identified by the Stimulus Ports.

4. Wait for DUT timing event. Sometimes referred to as a testing hook into the system. In our case this is a data message returned from the device to indicate that it has processed the stimulus and begun the timing algorithm.

5. Wait duration indicated by Timing Port. This is used to indicate the time at which the outputs should be in the correct state.

6. Sample Outputs. This involves recording the actual inputs that were applied, performing serial communications with the DUT and reading discrete outputs from the DUT.

7. Log Results. Store the results into a file for later analysis.

8. Log Period parameters. Some parameters are logged on a periodic rate to assist with the evaluation of the test results.

9. Sample Period. The sample period is usually determined by the dynamic nature of the parameter being logged.

TABLE 1

Execution Engine STD

Analysing the Results

The inventor originally envisaged that analysis would be the simpler activity, however, experience had shown that it may be the most time consuming activity, due to the textual nature of the Log Files. To assist with the analysis and significantly reduce the analysis time an embodiment of the invention provides a "LogViewer".

The LogViewer allows the performance of a number of repetitive functions quickly and easily. It provides the ability to:

Scroll backward and forwards between individual test vectors

Scroll backward and forwards between failed test vectors

Dynamically change the evaluation criteria by masking out particular ports from the evaluation Generate a list of failure types based on the evaluation criteria Synchronise all results with the current test vector, including all periodically logged data that had been captured during execution Graphically summarize the ports that had different data values between expected and actual results.

Scroll through adjacent test vectors to provide the developers with a good picture of the events that led up to failure.

Ability to handle large numbers of test vectors and large sets of periodic data.

The execution engine captures periodic data and graphs it over time whilst also scheduling the capture of output ports in accordance with the timing dictated by the model. Both of these sets of data are stored for post analysis and evaluation.

Multiple test vectors may often display the symptoms of a single failure. The ability to characterize these symptoms into failure types helps to group failures automatically. Providing a list of the failure types based upon the parameter mask (described above) applied allows the test engineer to focus their efforts.

Failures are grouped into types by creating a logical comparison of each port's actual versus expected result. These logical comparisons are placed into a binary string and like binary strings may be characterized as a failure type.

The LogViewer also allows filtering out or masking of certain ports. It may be helpful when filtering out test vectors that show symptoms related to particular ports.

Accuracy and Error Tolerance—Whenever the modelled world is compared with the real world this issue may be encountered. There are many ways to address this issue, some being highly complex and some being quite simple. Whatever method chosen to employ will depend greatly on the problem being solved. In the case of the present invention a simple solution is presented. In the case of an embodiment of the present invention we evaluate the acceptability of a result within the LogViewer. The expected results may be compared with the actual and have a tolerance, which the test engineer can dynamically change. This allows the test engineer to investigate accuracy by varying the tolerance band and observing the change in failure rate.

Given the ease with which an automatic test generation engine can combinatorially generate vast numbers of test vectors from modest sets of parameters even small increases to the original parameter sets will result in exponential increases in the effective number of vectors produced.

The question needs to be then asked, what is adequate? 1000 test vectors, 10,000 test vectors, 100,000 vectors, 1,000,000? More? 100 Billion?

These numbers may be possible. It is advisable to consider carefully the equivalence classes and boundary conditions; ensure that great care is taken to minimize the effectual ranges employed and the granularity utilised to generate the equivalence classes. Combinatorial generation carries the problem of state space explosion if not carefully managed. Nevertheless, the present invention has provided for the generation of test vector numbers in excess of 50,000. The overall execution time for these vectors is dependent on the real time behaviour of the functionality that is being exercised. Where the product is a communications protocol, for example, the time to execute each test vector may be in the order of milliseconds to seconds, conversely where the behaviour is related to opening or closing valves this could be seconds to minutes. It may depend in the product under test, however given that the intent is that the test vectors are executed automatically then vast numbers can be so executed over night or across weekends which means the cost of execution is reduced.

Model Coverage and Requirement Coverage Issues

One of the benefits of modelling with a CASE tool is that it may be possible to map what portions of the model have in fact been exercised by exploitation of the generated input test vectors. This is useful in that it indicates for the values chosen for each of the parameters being exercised what the resultant model coverage is. Given that the model as a minimum is based on the product requirements under test and mostly the transitions and states that reflect the requirements arise directly from the requirement statements it is a fair assumption that 100% model coverage may equate with 100% requirement coverage.

Figure 4:
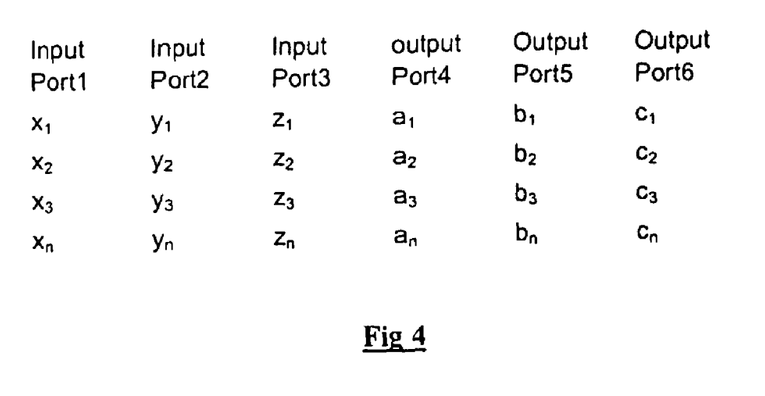
FIG. 4 illustrates yet another example results file in a format different to that of FIGS. 3a to 3c according to yet another embodiment of the present invention.

With reference to FIG. 4, another alternate test data format is shown resulting from use of the Matlab tool, which in contrast to an embodiment employing a tool such as Autofocus™ provides a slightly different format.

While this invention has been described in connection with specific embodiments thereof, it will be understood that it is capable of further modification(s). This application is intended to cover any variations uses or adaptations of the invention following in general, the principles of the invention and including such departures from the present disclosure as come within known or customary practice within the art to which the invention pertains and as may be applied to the essential features hereinbefore set forth.

As the present invention may be embodied in several forms without departing from the spirit of the essential characteristics of the invention, it should be understood that the above described embodiments are not to limit the present invention unless otherwise specified, but rather should be construed broadly within the spirit and scope of the invention as defined in the appended claims. Various modifications and equivalent arrangements are intended to be included within the spirit and scope of the invention and appended claims. Therefore, the specific embodiments are to be understood to be illustrative of the many ways in which the principles of the present invention may be practiced. In the following claims, means-plus-function clauses are intended to cover structures as performing the defined function and not only structural equivalents, but also equivalent structures. For example, although a nail and a screw may not be structural equivalents in that a nail employs a cylindrical surface to secure wooden parts together, whereas a screw employs a helical surface to secure wooden parts together, in the environment of fastening wooden parts, a nail and a screw are equivalent structures.

"Comprises/comprising" when used in this specification is taken to specify the presence of stated features, integers, steps or components but does not preclude the presence or addition of one or more other features, integers, steps, components or groups thereof."

The invention claimed is:

1. A method of testing at least one embedded device under test (DUT) comprising:
   determining a test configuration parameter set comprising predefined DUT test sequence rules;
   determining a first data set comprising input test vectors based on the test configuration parameter set;

processing the first data set in a DUT model to determine output test vectors wherein the output test vectors comprise DUT model generated responses to the input test vectors;

processing the first data set and the output test vectors, comprising:
 parsing the output test vectors with the first data set in accordance with a predefined timing reference in which the predefined timing reference determines a point in time to sample an output test vector as a stabilised output test vector; and
 matching each stabilised output test vector to form pairs of stabilised input and output test vectors to determine a second data set comprising pairs of stabilised input and output test vectors;

communicating the stabilised input test vectors to at least one DUT via a DUT independent interface so that the at least one DUT is stimulated by the stabilised input test vectors to produce DUT output vectors;

determining a third data set comprising the stabilised input vectors and corresponding DUT output vectors; and comparing the third data set with the second data set to determine a comparison of actual behaviour to modelled behaviour of the at least one DUT;

wherein the predefined timing reference is derived from a logical connection port adapted to indicate a predefined timing reference for determining a point in time at which to sample an output vector as the corresponding output vector in an input/output vector pair.

2. The method of claim 1 wherein the DUT independent interface comprises an interprocess communication protocol utilising one of:
 TCP/IP;
 Active-X; and
 a serial communications standard.

3. The method of claim 1 wherein the DUT model comprises at least one of the following abstraction techniques:
 architectural level descriptions;
 data type definitions;
 state transition diagrams; and
 extended Message Sequence Charts.

4. The method of claim 1 wherein the data set comprises test vector formatted files.

5. The method of claim 1 wherein the test configuration parameter set comprises a test parameter configuration file.

6. The method of claim 1 wherein the DUT comprises at least one of:
 a smoke detector;
 a fire detector;
 a security device;
 a medical device;
 a biological tissue processing device; and
 an industrial process device.

7. A computer-readable medium storing thereon a computer program comprising a set of instructions operable to cause a processor to perform the following operations, the operations comprising:
 determine a test configuration parameter set comprising predefined device under test (DUT) test sequence rules;
 determine a first data set comprising input test vectors based on the test configuration parameter set;
 process the first data set in a DUT model to determine output test vectors wherein the output test vectors comprise DUT model generated responses to the input test vectors;
 process the first data set and the output test vectors, comprising:
  parsing the output test vectors with the first data set in accordance with a predefined timing reference in which the predefined timing reference determines a point in time to sample an output test vector as a stabilised output test vector; and
  matching each stabilised output test vector to form pairs of stabilised input and output test vectors to determine a second data set comprising pairs of stabilised input and output test vectors;
 communicate the stabilised input test vectors to at least one DUT via a DUT independent interface so that the at least one DUT is stimulated by the stabilised input test vectors to produce DUT output vectors;
 determine a third data set comprising the stabilised input vectors and corresponding DUT output vectors; and
 compare the third data set with the second data set to determine a comparison of actual behaviour to modelled behaviour of the at least one DUT;
 wherein the predefined timing reference is derived from a logical connection port adapted to indicate a predefined timing reference to determine a point in time at which to sample an output vector as the corresponding output vector in an input/output vector pair.

* * * * *

UNITED STATES PATENT AND TRADEMARK OFFICE
CERTIFICATE OF CORRECTION

PATENT NO. : 7,623,981 B2
APPLICATION NO. : 10/591492
DATED : November 24, 2009
INVENTOR(S) : Hani Achkar et al.

It is certified that error appears in the above-identified patent and that said Letters Patent is hereby corrected as shown below:

In column 4, line 62, delete "detector." and insert -- detector; --, therefor.

In column 5, lines 60-63, after "vectors." delete "Preferably, the predetermined delay for each one of said actual device under test input test vectors is substantially the length of time before the corresponding output vector stabilises." and insert the same on Col. 5, Line 61 as a new paragraph.

In column 7, line 19, after "expense" insert -- . --.

In column 8, lines 29-30, delete "Ports, for example, RS-232 employing ADCP etc, and Ethernet Ports." and insert the same on Col. 8, Line 28, after "Communications" as a continuation of the same paragraph.

In column 10, line 2, before "interface" delete "in an".

In column 12, line 55, after "pairs)" insert -- . --.

In column 13, line 62, after "24" insert -- . --.

In column 14, line 5, delete "encountered)=" and insert -- encountered) --, therefor.

In column 14, line 11, delete "choose," and insert -- choose. --, therefor.

In column 15, line 17, after "changes" insert -- . --.

In column 17, lines 59-67, and in column 18, lines 1-9, delete "These numbers may be possible. It is advisable to consider carefully the equivalence classes and boundary conditions; ensure that great care is taken to minimize the effectual ranges employed and the granularity utilised to generate the equivalence classes. Combinatorial generation carries the problem of state space explosion if not carefully managed. Nevertheless, the present invention has provided for the generation of test vector numbers in excess of 50,000. The overall execution time for these vectors is dependent on the real time behaviour of the functionality that is being exercised. Where the product is a communications protocol, for example, the time to execute each test vector may be in the order of milliseconds to seconds, conversely where the behaviour is related to opening or closing valves this could be

CERTIFICATE OF CORRECTION (continued)
U.S. Pat. No. 7,623,981 B2 seconds to minutes. It may depend in the product under test, however given that the intent is that the test vectors are executed automatically then vast numbers can be so executed over night or across weekends which means the cost of execution is reduced." and
insert the same on Col. 17, Line 58, after "Billion?" as a continuation of the same paragraph.

Signed and Sealed this

Thirtieth Day of March, 2010

David J. Kappos
*Director of the United States Patent and Trademark Office*